(12) United States Patent
Cheng et al.

(10) Patent No.: US 12,469,700 B2
(45) Date of Patent: Nov. 11, 2025

(54) ION IMPLANTATION FOR REDUCED HYDROGEN INCORPORATION IN AMORPHOUS SILICON

(71) Applicant: Applied Materials, Inc., Santa Clara, CA (US)

(72) Inventors: Rui Cheng, San Jose, CA (US); Rajesh Prasad, Lexington, MA (US); Karthik Janakiraman, San Jose, CA (US); Gautam K. Hemani, San Jose, CA (US); Krishna Nittala, San Jose, CA (US); Shan Tang, Middleton, MA (US); Qi Gao, Wilmington, MA (US)

(73) Assignee: Applied Materials, Inc., Santa Clara, CA (US)

( * ) Notice: Subject to any disclaimer, the term of this patent is extended or adjusted under 35 U.S.C. 154(b) by 225 days.

(21) Appl. No.: 18/016,926

(22) PCT Filed: Jul. 21, 2021

(86) PCT No.: PCT/US2021/042610
§ 371 (c)(1),
(2) Date: Jan. 19, 2023

(87) PCT Pub. No.: WO2022/020496
PCT Pub. Date: Jan. 27, 2022

(65) Prior Publication Data
US 2023/0298892 A1    Sep. 21, 2023

Related U.S. Application Data

(60) Provisional application No. 63/054,320, filed on Jul. 21, 2020.

(51) Int. Cl.
*H01L 21/02* (2006.01)
*H01L 21/30* (2006.01)
(Continued)

(52) U.S. Cl.
CPC .. *H01L 21/02532* (2013.01); *H01L 21/02592* (2013.01); *H01L 21/3003* (2013.01); *H01L 21/32155* (2013.01); *H10D 30/0321* (2025.01)

(58) Field of Classification Search
CPC ....... H01L 21/0415; H01L 21/046–047; H01L 21/2253; H01L 21/265–266;
(Continued)

(56) References Cited

U.S. PATENT DOCUMENTS 4,571,348 A * 2/1986 Troxell ............... H01L 21/0262
427/574
5,194,349 A * 3/1993 Tsuo ........................ G11B 7/24
430/21
(Continued)

FOREIGN PATENT DOCUMENTS

CN    105070686 A    11/2015
JP    08298242 A     11/1996
(Continued)

OTHER PUBLICATIONS

International Search Report and Written Opinion mailed on Nov. 5, 2021 in International Patent Application No. PCT/US2021/042610, 9 pages.
(Continued)

*Primary Examiner* — Amar Movva
(74) *Attorney, Agent, or Firm* — Kilpatrick Townsend & Stockton LLP (57) ABSTRACT

Exemplary methods of semiconductor processing may include forming a layer of amorphous silicon on a semiconductor substrate. The layer of amorphous silicon may be characterized by a first amount of hydrogen incorporation. The methods may include performing a beamline ion implantation process or plasma doping process on the layer of amorphous silicon. The methods may include removing
(Continued)

hydrogen from the layer of amorphous silicon to a second amount of hydrogen incorporation less than the first amount of hydrogen incorporation.

20 Claims, 3 Drawing Sheets

(51) Int. Cl.
*H01L 21/3215* (2006.01)
*H10D 30/01* (2025.01)

(58) Field of Classification Search
CPC .............. H01L 21/3115–31155; H01L 21/3215–32155; H01L 21/425–426; H01L 21/76825; H01L 21/76859; H01L 21/76862; H01L 21/3003; H01L 21/02532; C23C 14/48; H10D 30/0321
See application file for complete search history.

(56) References Cited

U.S. PATENT DOCUMENTS

| | | | |
|---|---|---|---|
| 7,718,231 B2 | 5/2010 | Choe et al. | |
| 2001/0038127 A1* | 11/2001 | Yamazaki | H10D 86/431 |
| | | | 257/E29.151 |
| 2001/0046017 A1* | 11/2001 | Niwano | G02F 1/134363 |
| | | | 349/141 |
| 2002/0004262 A1* | 1/2002 | Asami | H01L 21/0237 |
| | | | 257/E29.294 |
| 2002/0043660 A1* | 4/2002 | Yamazaki | H10D 86/0229 |
| | | | 257/E21.414 |
| 2002/0070406 A1* | 6/2002 | Yamazaki | H01L 29/78675 |
| | | | 257/E29.294 |
| 2003/0148565 A1 | 8/2003 | Yamanaka | |
| 2005/0208714 A1 | 9/2005 | Yamazaki et al. | |
| 2007/0048992 A1* | 3/2007 | Hosokawa | H10D 30/0316 |
| | | | 257/E21.414 |
| 2007/0298550 A1 | 12/2007 | Machida et al. | |
| 2015/0243768 A1 | 8/2015 | Yamazaki | |
| 2019/0165181 A1* | 5/2019 | Hekmatshoartabari | |
| | | | H10D 30/6715 |
| 2020/0135467 A1 | 4/2020 | Ma et al. | |

FOREIGN PATENT DOCUMENTS

| | | |
|---|---|---|
| JP | 08306760 A | 11/1996 |
| JP | 2003243321 A | 8/2003 |
| JP | 2005033038 A | 2/2005 |
| KR | 950004582 A | 2/1995 |
| KR | 960006056 A | 2/1996 |
| KR | 970024766 A | 5/1997 |
| KR | 20050103813 A | 11/2005 |
| KR | 20050103815 A | 11/2005 |
| KR | 100769833 B1 | 10/2007 |
| KR | 20120109374 A | 10/2012 |
| KR | 101328881 B1 | 11/2013 |
| TW | 201246305 A | 11/2012 |
| WO | 2022020496 A1 | 1/2022 |

OTHER PUBLICATIONS

Application No. PCT/US2021/042610 , International Preliminary Report on Patentability, Mailed On Feb. 2, 2023, 6 pages.
Office Action with Search Report for Taiwan Patent Appln No. 110126523 mailed Jan. 26, 2022, 5 pages.
Notice of Decision to Grant Report for Taiwan Patent Appln No. 110126523 mailed Aug. 30, 2022, 4 pages.
Office Action for Korean Appln No. 1020237005925 mailed May 17, 2024, 10 pages.
JP2023-504256, "Office Action", Jun. 10, 2025, 12 pages.

* cited by examiner

ION IMPLANTATION FOR REDUCED HYDROGEN INCORPORATION IN AMORPHOUS SILICON

CROSS-REFERENCE TO RELATED APPLICATIONS

This application is a 371 National Stage filing of PCT Application No. PCT/US2021/042610, filed Jul. 21, 2021, entitled "ION IMPLANTATION FOR REDUCED HYDROGEN INCORPORATION IN AMORPHOUS SILICON", which claims the benefit and priority of U.S. Provisional Application No. 63/054,320, filed Jul. 21, 2020, entitled "ION IMPLANTATION FOR REDUCED HYDROGEN INCORPORATION IN AMORPHOUS SILICON", which is hereby incorporated by reference in its entirety.

TECHNICAL FIELD

The present technology relates to methods and systems for semiconductor processing. More specifically, the present technology relates to systems and methods for producing films with reduced hydrogen content.

BACKGROUND

Integrated circuits are made possible by processes which produce intricately patterned material layers on substrate surfaces. Producing patterned material on a substrate requires controlled methods for forming and removing material. As device sizes continue to reduce, film characteristics may lead to larger impacts on device performance. Materials used to form layers of materials may affect operational characteristics of the devices produced. As material thicknesses continue to reduce, as-deposited characteristics of the films may have a greater impact on device performance.

Thus, there is a need for improved systems and methods that can be used to produce high quality devices and structures. These and other needs are addressed by the present technology.

SUMMARY

Exemplary methods of semiconductor processing may include forming a layer of amorphous silicon on a semiconductor substrate. The layer of amorphous silicon may be characterized by a first amount of hydrogen incorporation. The methods may include performing an ion implantation process on the layer of amorphous silicon. The methods may include removing hydrogen from the layer of amorphous silicon to a second amount of hydrogen incorporation less than the first amount of hydrogen incorporation.

In some embodiments, the semiconductor substrate may be maintained at a temperature below or about 450° C. during the semiconductor processing method. The ion implantation process may be performed at a temperature of greater than or about 300° C. The ion implantation process may be performed with helium, neon, argon, or silicon ions. The ion implantation process may be or include a beamline ion implantation process or a plasma doping implantation process. The second amount of hydrogen incorporation may be less than or about 1 at. %.

Some embodiments of the present technology may encompass semiconductor processing methods. The methods may include forming a thin-film transistor on a semiconductor substrate. The thin-film transistor may include a layer of amorphous silicon characterized by a first amount of hydrogen incorporation. The methods may include transferring the semiconductor substrate to a beamline ion implantation chamber or plasma doping chamber. The methods may include performing a beamline ion implantation or plasma doping process on the thin-film transistor. The methods may include reducing an amount of hydrogen from the layer of amorphous silicon to a second amount of hydrogen incorporation less than the first amount of hydrogen incorporation.

In some embodiments, the thin-film transistor may include a multilayer stack including the layer of amorphous silicon and one or more layers of doped or undoped amorphous silicon. The multilayer stack may include at least one layer of doped amorphous silicon. A dopant of the doped amorphous silicon includes one or more of phosphorous, boron, or arsenic. The thin-film transistor may be characterized by a thickness of greater than or about 100 nm. The layer of amorphous silicon may be formed at a temperature of less than or about 500° C. The beamline ion implantation process or the plasma doping may be performed at a temperature of less than or about 550° C. The beamline ion implantation or plasma doping process may be performed at a temperature of greater than or about 300° C. The beamline ion implantation or plasma doping process may be performed with helium, neon, argon, or silicon ions. The second amount of hydrogen incorporation may be less than or about 1 at. %. An amount of hydrogen incorporation throughout the thin-film transistor may be reduced to less than or about 1 at. %.

Some embodiments of the present technology may encompass semiconductor processing methods. The methods may include forming a thin-film transistor on a semiconductor substrate within a first semiconductor processing chamber. The thin-film transistor may include a layer of amorphous silicon characterized by a first amount of hydrogen incorporation. The layer of amorphous silicon may be disposed between at least two additional layers of material. The methods may include transferring the semiconductor substrate from the first semiconductor processing chamber to an ion implantation chamber. The methods may include performing an ion implantation process on the thin-film transistor. The ion implantation process may be or include a beamline ion implantation process or a plasma doping implantation process. The methods may include reducing an amount of hydrogen from the layer of amorphous silicon to a second amount of hydrogen incorporation less than the first amount of hydrogen incorporation.

In some embodiments, the at least two additional layers of material include one or more layers of doped amorphous silicon. A dopant of the doped amorphous silicon may include phosphorous, boron, or arsenic. The layer of amorphous silicon may be formed at a temperature of less than or about 500° C., and the ion implantation process may be performed at a temperature of greater than or about 300° C. The first amount of hydrogen incorporation may be at least about 5 at. %, and the second amount of hydrogen incorporation may be less than or about 1 at. %. The layer of amorphous silicon may be further characterized by an amount of nitrogen incorporation, and the amount of nitrogen incorporation may be reduced to less than or about 0.5 at. %.

Such technology may provide numerous benefits over conventional systems and techniques. For example, embodiments of the present technology may produce films characterized by reduced hydrogen content. Additionally, the present technology may reduce hydrogen content without increasing film stress or porosity from hydrogen outgassing. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As semiconductor device sizes continue to reduce, the constituent films included within a structure may affect device performance, as well as fabrication of other materials being included in the device. For example, processes to form silicon-containing films may use silane or other silicon-containing materials. These precursors may include hydrogen that may be incorporated within the film. Incorporating hydrogen into the film may cause additional issues during processing. For example, hydrogen incorporated in the film may be less thermally stable, and during later processing, outgassing may occur. Additionally, hydrogen may affect film stress, which may cause the film to become increasingly compressive, which can cause film delamination as well. Finally, volumes of hydrogen within the plasma may affect the deposition process, and may cause increased grain size and crystallinity of the formed film, which may challenge deposition processes intending to form amorphous silicon films.

To reduce or compensate for hydrogen incorporation, conventional technologies may change deposition parameters, or may perform remedial actions. For example, when deposition is performed at higher temperatures, such as above or about 500° C., or above or about 600° C., hydrogen may be released during the deposition, which may improve the film quality and characteristics. Additionally, conventional technologies may perform an anneal subsequent to film deposition. The anneal process may densify the film and allow hydrogen to be removed from the structure. Although these techniques may be effective during some fabrication operations, other processes may be limited by a thermal budget.

For example, during thin-film transistor formation, or any number of other processing operations, amorphous silicon may be formed on or within a device. In some of these devices, underlying materials or structures may be incapable of withstanding temperatures associated with high-temperature deposition or anneals, and may be limited to processing temperatures that are less than or about 550° C., less than or about 500° C., less than or about 450° C., less than or about 400° C., or less. Conventional technologies may be limited to producing films having hydrogen incorporation of up to 10 at. % or more. For thin-film transistor formation, increased hydrogen incorporation may impact mobility or performance of the transistor.

A correlation may exist between hydrogen-content in amorphous silicon films and device mobility. For example, hydrogen incorporation may cause a greater amount of silicon-hydrogen bonds within the film structure. These bonds may form boundaries between grains or between crystal interfaces. Boundaries may become locations where electrons and holes traveling through the channel region may be scattered. This scattering of electrons and holes may degrade the mobility and electrical performance of the channel material. Consequently, by reducing hydrogen incorporation in films for thermally-constrained structures, transistor or other film performance may increase over conventional structures.

The present technology overcomes these issues by performing an ion implantation process to break constituent bonds and release hydrogen from the films. By implanting ions with sufficient energy, hydrogen bonds may be broken allowing hydrogen to be released from the films. Additionally, by utilizing particular ion implantation techniques, or by adjusting ion dosing, substrate temperature during implant, sputtering, and material affects may be limited.

Although the remaining disclosure will routinely identify specific deposition processes utilizing the disclosed technology, it will be readily understood that the systems and methods are equally applicable to other deposition and etch processes as may occur in the described chambers or any other chamber. Accordingly, the technology should not be considered to be so limited as for use with these specific deposition processes or chambers alone. The disclosure will discuss one set of possible chambers that may be used to perform processes according to embodiments of the present technology before additional variations and adjustments to this system according to embodiments of the present technology are described.

Figure 1:
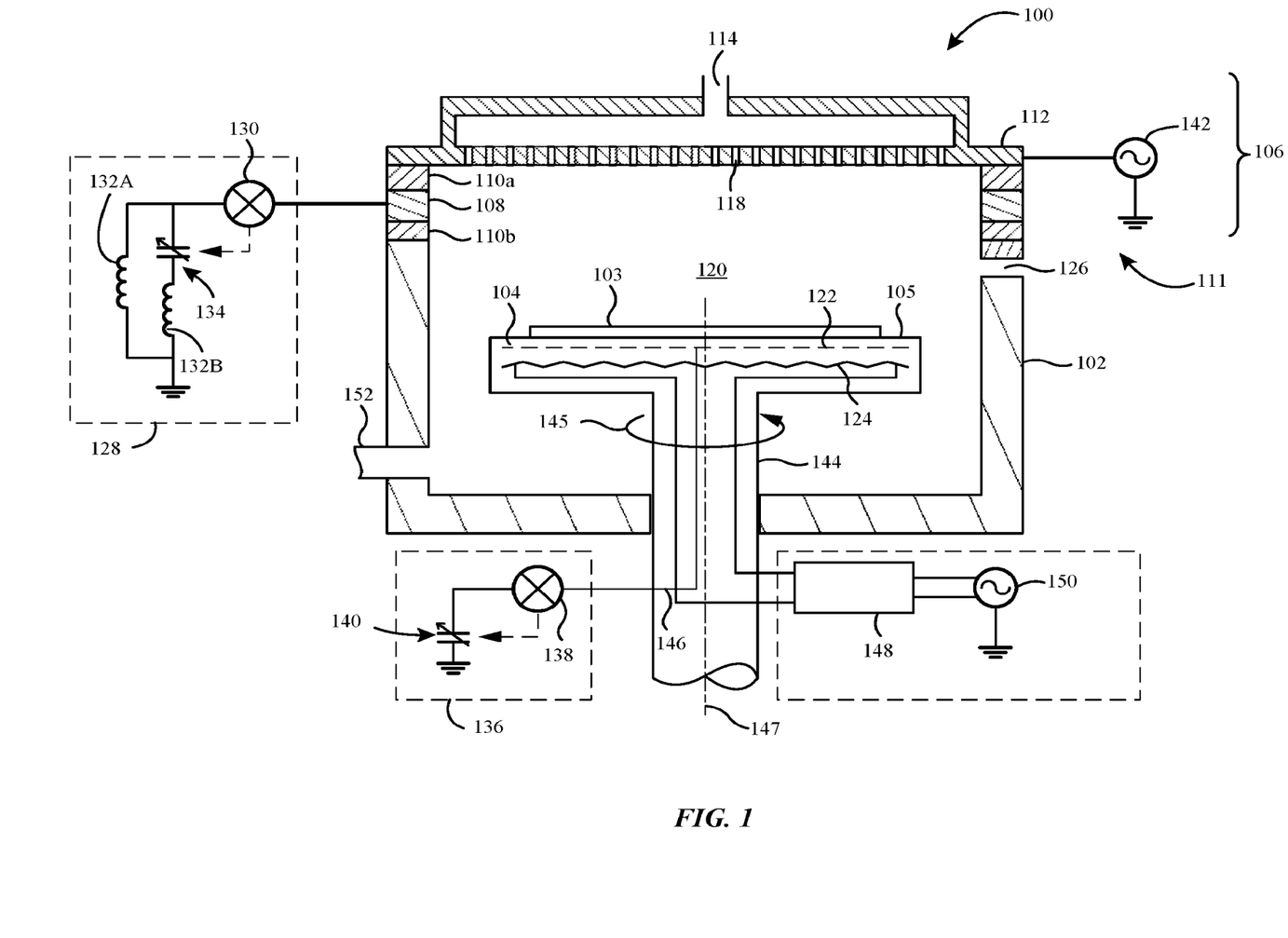
FIG. 1 shows a schematic cross-sectional view of an exemplary plasma deposition system according to some embodiments of the present technology.

FIG. 1 shows a cross-sectional view of an exemplary processing chamber 100 according to some embodiments of the present technology. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
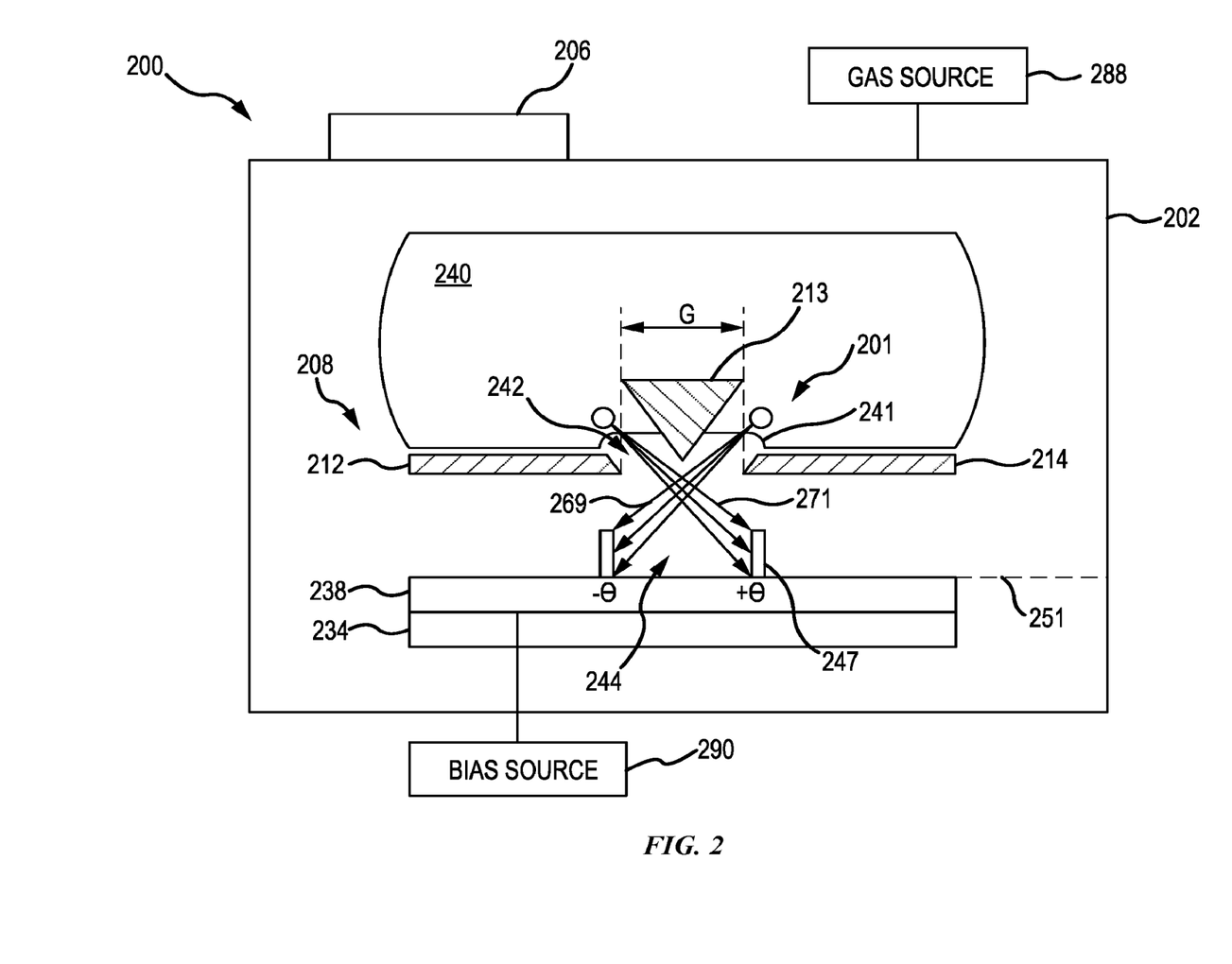
FIG. 2 shows a schematic cross-sectional view of an exemplary ion implant system according to some embodiments of the present technology.

FIG. 2 shows a schematic cross-sectional view of an exemplary ion implant system 200 according to some embodiments of the present technology. System 200 may be utilized to implant electrons or ions into a film layer that may alter characteristics of the film layer, such as to break bonds within the film and allow hydrogen to be released from formed layers on a substrate. It is to be understood that system 200 is merely one example of a beamline ion implantation chamber that may be used in some embodiments of the present technology. Any number of other chambers may be utilized in embodiments of the present technology that may allow ion implantation to occur, including plasma doping chambers, or other implantation systems. For example, ion implant system 200 is only one example of an apparatus that may be used. In embodiments of the present technology, traditional plasma processing apparatuses may be used, pattern beams, electron beams that may be pulsed or continuous, raster scanning, variable scanning, and any other method of implanting ions or electrons may be used. According to certain aspects, one or more energetic particle beams may include a cylindrical shaped beam, a plurality of adjacent or overlapping cylindrical beams, or a ribbon shaped beam including a continuous rectangular shaped beam. The one or more energetic particle beams may be moved relative to the substrate during processing and/or the substrate can be moved relative to the energetic particle beam during processing.

The plasma processing system 200 may include a process chamber 202, a platen 234, a source 206, and a modifying element 208. The platen 234 may be positioned in the processing chamber 202 for supporting a substrate 238. The platen 234 may be coupled with an actuator, which may allow the platen 234 to moved or translated in one or more horizontal and/or vertical directions during a scanning motion. The scanning motion may be performed within a single horizontal plane which may be substantially parallel to the modifying element 208. The source 206 may be configured to generate a plasma 240 in the process chamber 202. The modifying element 208 may include a pair of insulators 212, 214 which may define a gap between the insulators and having a horizontal spacing G. The insulators 212, 214 may be or include any number of insulating materials, or semi-conducting materials. In some embodiments the elements may alternatively be a conductive material. The modifying element may also include a directional element 213 disposed in a position relative to the insulators 212, 214 such that ions 201 may be directed toward the substrate 238.

In operation, a gas source 288 may supply an ionizable gas to the process chamber 202. Examples of an ionizable gases may be or include any number of precursors including one or more constituent elements or ions. For example, precursors may include any material or materials which may be ionized to produce one or more ions including, alone or in combination, helium, hydrogen, neon, argon, krypton, fluorine, carbon, boron, nitrogen, or any other element or combination of elements. The source 206 may generate the plasma 240 by exciting and ionizing the gas provided to the process chamber 202. The ions 201 may be attracted from the plasma 240 across the plasma sheath 242. For example, a bias source 290 may be configured to bias the substrate 238 to attract the ions 201 from the plasma 240 across the plasma sheath 242. The bias source 290 may be a DC power supply to provide a DC voltage bias signal or an RF power supply to provide an RF bias signal.

The modifying element 208 may modify the electric field within the plasma sheath 242 to control a shape of the boundary 241 between the plasma 240 and the plasma sheath 242. The modifying element 208 may include the insulators 212, 214 and directional element 213 in some embodiments. The insulators 212, 214 and directional element 213 may be fabricated from materials such as quartz, alumina, boron nitride, glass, silicon nitride, or any number of other suitable materials. The boundary 241 between the plasma 240 and the plasma sheath 242 may be dependent on the placement of the directional element 213 relative to the insulators 212, 214 as the directional element 213 may alter the electric field within the plasma sheath 242.

Ions following a trajectory path 271 may strike the substrate 238 at about an angle of +θ normal to the plane 251. Ions following trajectory path 269 may strike the substrate 438 at an angle of about −θ normal to the plane 251. Accordingly, the range of incident angles normal to the plane 251 may be between about +1° and about +65° and between about −1° and about −65°, which may exclude 0° in some embodiments. For example, a first range of incident angles normal to the plane 250 may be between about +5° and about +65° and a second range of incident angles may be between about −5° and about −65°. In some embodiments, the first range of incident angles relative to the plane 251 may be between about −10° and about −20° and the second range of incident angles relative to the plane 451 may be between about +10° and about +20°. In addition, in some embodiments ion trajectories occurring from paths 269 and 271 may cross one another. Depending on a number of factors, which may including the positioning of the directional element 213, a horizontal spacing between the insulators 212, 214, a vertical spacing of the insulators 212, 214 above the plane 251, the dielectric constant of the directional element 213 and the insulators 212, 214, and other plasma processing parameters, the range of incident angles (θ), in some embodiments, may be between about +89° and about −89°, which may exclude 0°.

In general, ions provided to a film on the substrate may alter various characteristics of the film. The range of incident angles may be selected based upon an aspect ratio of a 3D feature on the substrate 238. For example, sidewalls 247 of a trench 244, having an exaggerated size for clarity of illustration, may be more uniformly treated by the ions 201 than with conventional plasma processing apparatuses and procedures. The aspect ratio, which may be defined as the relationship between a pitch between the sidewalls 247 and a height of the sidewalls 247 extending from the substrate 238, may determine the angles at which the ions 201 are provided to provide more uniform treatment on the sidewalls 247. For example, a first range of incident angles normal to the plane 251 and adapted to impact the sidewalls 247 may be between about +60° and about +90°, and a second range of incident angles may be between about −60° and about −90°. Any number of different angles may similarly be employed. In some embodiments, angles at which the ions 201 may be provided may be selected to avoid contact with material below the sidewalls 247, for example the substrate 238 or an insulator.

Figure 3:
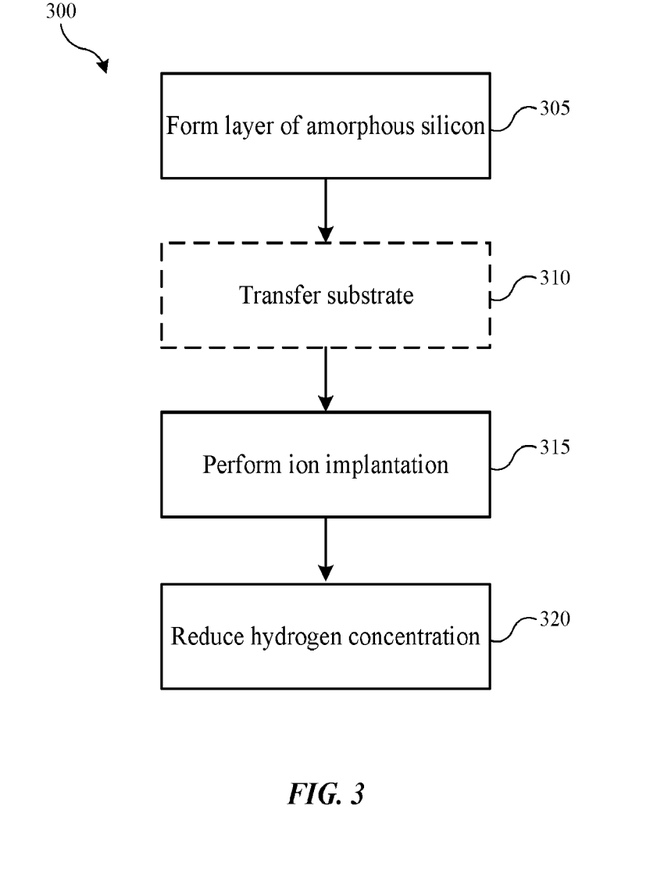
FIG. 3 shows operations in a semiconductor processing method according to some embodiments of the present technology.

FIG. 3 shows exemplary operations in a processing method 300 according to some embodiments of the present technology. The method may be performed in a variety of processing chambers, including processing chambers 100 and or 200 described above. Method 300 may include one or more operations prior to the initiation of the stated method operations, including front end processing, deposition, etching, polishing, cleaning, or any other operations that may be performed prior to the described operations. The method may include a number of optional operations as denoted in the figure, which may or may not specifically be associated with the method according to the present technology. For example, many of the operations are described in order to provide a broader scope of the semiconductor process, but are not critical to the technology, or may be performed by alternative methodology as will be discussed further below.

Method 300 may involve optional operations to develop the semiconductor structure to a particular fabrication operation. Although in some embodiments method 300 may be performed on a base structure, in some embodiments the method may be performed subsequent other material formation or removal. For example, any number of deposition, masking, or removal operations may be performed to produce any transistor, memory, or other structural aspects on a substrate. The substrate may be disposed on a substrate support, which may be positioned within a processing region of a semiconductor processing chamber. The operations may be performed in the same chamber in which aspects of method 300 may be performed, and one or more operations may also be performed in one or more chambers on a similar platform as a chamber in which operations of method 300 may be performed, or on other platforms.

In some embodiments, method 300 may include forming a layer of amorphous silicon on a substrate at operation 305. The formation or deposition may be performed using any number of precursors, such as silane or other silicon-containing materials, and in some embodiments a silicon-containing precursor delivered may also include hydrogen. Consequently, the deposited or formed layer of amorphous silicon may be characterized by a first amount of hydrogen incorporation. It is to be understood that the present technology may not be limited to silicon films, such as amorphous silicon. The present technology may also encompass hydrogen management in any number of films formed on semiconductor substrates. Consequently, the amorphous silicon layer should be considered as only one example film for which the present technology may apply.

The layer of amorphous silicon may be part of any number of structures, which may include thin-film transistor structures in some embodiments. For example, in some embodiments the layer of amorphous silicon may be one of multiple layers in a stack of films formed over a substrate. In some embodiments the layers of amorphous silicon may be included with or between other layers of material, such as other silicon-containing or other material layers. In some thin-film transistor structures, the amorphous silicon layer may be formed between layers of doped amorphous silicon. For example, one or more layers above and/or below the layer of amorphous silicon may be formed with a dopant, such as phosphorous, boron, arsenic, or other materials. The dopant may form an n-type layer of material, and thus a thin-film transistor structure may include n-type, doped amorphous silicon disposed on either side of a formed amorphous silicon layer. Each layer of the stack, including the amorphous silicon layer may be characterized by a film thickness of less than or about 500 nm, and may be characterized by a film thickness of less than or about 400 nm, less than or about 350 nm, less than or about 300 nm, less than or about 250 nm, less than or about 200 nm, less than or about 150 nm, less than or about 100 nm, less than or about 50 nm, or less.

As noted previously, some embodiments of the present technology may encompass films formed over materials or structures characterized by a thermal budget less than or about 550° C., less than or about 500° C., less than or about 450° C., less than or about 400° C., less than or about 350° C., less than or about 300° C., or less. Accordingly, the layer of amorphous silicon may be formed at or below any of these temperatures in some embodiments to accommodate the underlying materials, and in some embodiments one or more operations, including all operations of method 300, may be performed at or below any of these temperatures, and a substrate being processed may be maintained below or about any of these temperatures throughout processing. Processing pressures during formation may be greater than or about 1 Torr in some embodiments, and may be between about 2 Torr and about 20 Torr. The film may also be formed with any silicon-containing material, such as silane or other binary silicon-hydrogen compounds, as well as any silicon-and-hydrogen-containing precursor. Consequently, the formed layer may be characterized by a first amount of hydrogen incorporation. Because higher temperature deposition and anneals may not be feasible for some structures, the hydrogen incorporation may be up to or greater than or about 3 at. %, greater than or about 5 at. %, greater than or about 7 at. %, greater than or about 10 at. %, or more. This may cause any of the challenges described previously, including stress effects and subsequent outgassing.

Subsequent film formation, in some embodiments the substrate on which the layer of amorphous silicon was formed may be transferred from a first processing chamber to a second processing chamber at optional operation 310. For example, formation or deposition of the amorphous silicon layer may be performed in a first chamber, such as chamber 100 or any other deposition chamber in which a silicon-containing material may be deposited. Subsequent deposition, the substrate may be moved to a second chamber for an ion implantation process. The second chamber may be included on the same platform or tool as the first chamber, although in some embodiments the substrate may be moved between tools for an ion implantation process.

At operation 315, an ion implantation process, such as beamline ion implantation, may be performed on one or more layers of the substrate, including the amorphous silicon layer. Additionally, a plasma doping process may be performed. Although termed an ion implantation, the process may involve an ion modification in which ion implantation is performed to break bonds within the formed film and release materials from the film, and which may include also releasing ions of the ion implantation process. The process may include a beamline ion implantation process, a plasma doping implantation process, or any other implantation as noted previously. The ion implantation process may be performed to modify characteristics of the film. For example, in some embodiments the ion implantation may be performed to break silicon-hydrogen bonds within the layers of material, which may allow hydrogen to be removed from the film. In multilayer stacks, the ion implantation process may be tuned to penetrate one or more layers of the stack, which may allow hydrogen to be reduced in multiple layers, including all layers of doped and undoped material.

The ion implantation process may be performed at low pressure, depending on the process performed. For example, plasma doping ion implantation may be performed at chamber pressures less than or about 100 mTorr, less than or about 10 mTorr, less than or about 1 mTorr, or less. Beamline ion implantation may be performed at much lower pressures, such as less than or about 0.1 mTorr, less than or about 0.05 mTorr, less than or about 0.01 mTorr, or less. These low pressure operations may facilitate transmission of ions through the film structure. Ion implantation processes may be performed at a variety of substrate temperatures, such as from about 25° C. up to or about 550° C. Exemplary beamline ion implantation species may include inert materials, such as helium, neon, or argon, which will not bond with amorphous silicon. Additionally, silicon species may be used and may bond with amorphous silicon without doping the material rendering the material n or p-type. An energy range for ion implantation may depend on the species used. For example, for relatively lighter species, such as helium, the energy range may be lower than for heavier species, such as silicon. For light to heavy species, the implant energy range may be from about 500 eV to 300 keV, with an implant does in the range of from about $1e^{13}$ to $1e^{16}$ ions/cm$^2$. For example, helium dosed at an energy of about 300 keV may modify up to 2 µm or more of amorphous silicon, while a silicon species would modify less than 1 µm.

The temperature at which the process may be performed may affect the energy of the ions, and in some embodiments a hot ion implantation may be performed, which may improve breakage of silicon-hydrogen bonds. For example, in some embodiments sufficient removal of hydrogen may occur at temperatures above or about 200° C., and may occur at temperatures greater than or about 250° C., greater than or about 300° C., greater than or about 350° C., greater than or about 400° C., greater than or about 450° C., or higher, although in some embodiments the ion implantation process may be performed at less than or about any of the thermal budget temperatures described previously. If plasma doping is performed, a doping bias voltage may range from about 500 eV to 10 keV or more. By increasing the bias voltage, thicker films may be modified. As one non-limiting example, bias voltage closer to 10 kV may modify films characterized by a thickness of 100 nm to 200 nm using lighter species, such as helium. The plasma doping may be performed in a range of from $5e^{15}$ to $1e^{17}$ ions/cm$^2$. Plasma doping may also be performed in a temperature range of from about 25° C. to about 500° C.

The ion implantation may use ions produced from any number of precursors. For example, in some embodiments ion implantation may be performed with helium, which as a relatively light ion may easily extend through a structure of over 100 nm or more, which may allow removal of hydrogen at further depths within the film. Helium ion implantation may be performed at higher powers, which may facilitate bond breaking within the film to allow hydrogen to be removed. Helium may have a tendency to be trapped within the films when ion implantation may be performed, and thus to facilitate release of helium, ion implantation may be performed at temperatures above or about 250° C., greater than or about 300° C., or higher. In some embodiments, silicon ions may be used in the ion implantation process from any number of silicon-containing precursors. Silicon may be characterized by a heavier mass, which may facilitate bond breaking in some embodiments. Consequently, lower temperature, higher implant energy processes may be performed with silicon. Similarly, because the films being modified may be amorphous silicon, silicon ions may not operate as a dopant to the film, and entrapment or incorporation may not detrimentally affect the film produced. Additionally, controlling an implant depth may be easier with heavier ions, and thus improved control over the depth of implant and modification may be provided. For example, the process may be controlled to affect one or more layers of a thin film transistor structure, but may be limited from more than minimal penetration into underlying structures.

An amount of densification may occur of the films based on removal of hydrogen and reformation of bonds through the film. Accordingly, in some embodiments a thickness of the film after an ion modification process may be less than or about 99% a thickness of the layer or film as deposited. In some embodiments the thickness may be less than or about 98% a thickness of the as-deposited film, and may be less than or about 97%, less than or about 96%, less than or about 95%, less than or about 94%, less than or about 93%, less than or about 92%, less than or about 91%, less than or about 90%, or less, although a thickness of the layer subsequent ion modification may be maintained at greater than or about 80%, greater than or about 85%, greater than or about 87%, greater than or about 90%, greater than or about 92%, greater than or about 95%, or more.

Sputtering may be limited of the film formed as dosing of ion implantation may be controlled relative to other plasma-enhanced processes. For example, in some embodiments, the dosage of ions may be greater than or about $1\times10^{16}$ ions/cm$^2$, and may be greater than or about $1\times10^{17}$ ions/cm$^2$, greater than or about $1\times10^{18}$ ions/cm$^2$, or more. Plasma doping implantation may be characterized by higher dosing than beamline implantation, which may facilitate use with helium to break bonds and release hydrogen from films. As the ion implantation is performed, an amount of hydrogen within the layer may be reduced in operation 320 to a second amount of hydrogen incorporation, which may be less than the first amount of hydrogen incorporation. The second amount of hydrogen incorporation, or an amount remaining in any layer of the thin-film transistor or amorphous silicon layer may less than or about 5 at. %, and may be less than or about 3 at. %, less than or about 1 at. %, less than or about 0.5 at. % or less.

Other materials within the amorphous silicon layer or any thin-film transistor layer may also be reduced or removed. For example, in some embodiments nitrogen may be incorporated within the as-deposited film. Nitrogen may exist in the deposition environment, or be incorporated within chamber seasoning materials, which may expose the formed films to nitrogen incorporation. In some embodiments the ion implantation process may similarly remove nitrogen from one or more layers, and may reduce an amount of nitrogen incorporation within the film to less than or about 1 at. %, and may reduce the nitrogen incorporation to less than or about 0.5 at. %, less than or about 0.3 at. %, less than or about 0.1 at. %, or less. By utilizing an ion implantation or modification process, hydrogen incorporation within a film may be reduced from as-deposited levels, which may increase electrical performance of materials deposited. Additionally, by utilizing ion implantation techniques, hydrogen removal may occur at lower temperatures, which may accommodate structures that may be constrained by a thermal budget.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursor, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
   forming a layer of amorphous silicon on a semiconductor substrate, wherein the layer of amorphous silicon is characterized by a first amount of hydrogen incorporation; and
   performing an ion implantation process on the layer of amorphous silicon to remove hydrogen from the layer of amorphous silicon to a second amount of hydrogen incorporation less than the first amount of hydrogen incorporation, wherein the ion implantation process is performed at a temperature of greater than or about 200° C.

2. The semiconductor processing method of claim 1, wherein the semiconductor substrate is maintained at a temperature below or about 450° C. during the semiconductor processing method.

3. The semiconductor processing method of claim 1, wherein the ion implantation process is performed at a temperature of greater than or about 300° C.

4. The semiconductor processing method of claim 1, wherein the ion implantation process is performed with helium, neon, argon, or silicon ions.

5. The semiconductor processing method of claim 1, wherein the ion implantation process comprises a beamline ion implantation process or a plasma doping implantation process.

6. The semiconductor processing method of claim 1, wherein the second amount of hydrogen incorporation is less than or about 1 at. %.

7. A semiconductor processing method comprising:
   forming a thin-film transistor on a semiconductor substrate, wherein the thin-film transistor comprises a layer of amorphous silicon characterized by a first amount of hydrogen incorporation;
   transferring the semiconductor substrate to a beamline ion implantation chamber or plasma doping chamber; and
   performing a beamline ion implantation or plasma doping process on the thin-film transistor to reduce an amount of hydrogen from the layer of amorphous silicon to a second amount of hydrogen incorporation less than the first amount of hydrogen incorporation, wherein the second amount of hydrogen incorporation is less than or about 5 at. %.

8. The semiconductor processing method of claim 7, wherein the thin-film transistor comprises a multilayer stack including the layer of amorphous silicon and one or more layers of doped or undoped amorphous silicon.

9. The semiconductor processing method of claim 8, wherein the multilayer stack includes at least one layer of doped amorphous silicon, and wherein a dopant of the doped amorphous silicon includes one or more of phosphorous, boron, or arsenic.

10. The semiconductor processing method of claim 7, wherein the thin-film transistor is characterized by a thickness of greater than or about 100 nm.

11. The semiconductor processing method of claim 7, wherein the layer of amorphous silicon is formed at a temperature of less than or about 500° C., and wherein the beamline ion implantation process or the plasma doping is performed at a temperature of less than or about 550° C.

12. The semiconductor processing method of claim 11, wherein the beamline ion implantation or plasma doping process is performed at a temperature of greater than or about 300° C.

13. The semiconductor processing method of claim 7, wherein the beamline ion implantation or plasma doping process is performed with helium, neon, argon, or silicon ions.

14. The semiconductor processing method of claim 7, wherein the second amount of hydrogen incorporation is less than or about 1 at. %.

15. The semiconductor processing method of claim 14, wherein an amount of hydrogen incorporation throughout the thin-film transistor is reduced to less than or about 1 at. %.

16. A semiconductor processing method comprising:
    forming a thin-film transistor on a semiconductor substrate within a first semiconductor processing chamber, wherein the thin-film transistor comprises a layer of amorphous silicon characterized by a first amount of hydrogen incorporation, and wherein the layer of amorphous silicon is disposed between at least two additional layers of material;
    transferring the semiconductor substrate from the first semiconductor processing chamber to an ion implantation chamber;
    performing an ion implantation process on the thin-film transistor, wherein the ion implantation process comprises a beamline ion implantation process or a plasma doping implantation process to reduce an amount of hydrogen from the layer of amorphous silicon to a second amount of hydrogen incorporation less than the first amount of hydrogen incorporation, wherein the second amount of hydrogen incorporation is less than or about 5 at. %.

17. The semiconductor processing method of claim 16, wherein the at least two additional layers of material comprise one or more layers of doped amorphous silicon, wherein a dopant of the doped amorphous silicon comprises phosphorous, boron, or arsenic.

18. The semiconductor processing method of claim 16, wherein the layer of amorphous silicon is formed at a temperature of less than or about 500° C., and wherein the ion implantation process is performed at a temperature of greater than or about 300° C.

19. The semiconductor processing method of claim 16, wherein the first amount of hydrogen incorporation is at least about 5 at. %, and wherein the second amount of hydrogen incorporation is less than or about 1 at. %.

20. The semiconductor processing method of claim 16, wherein the layer of amorphous silicon is further characterized by an amount of nitrogen incorporation, and wherein the amount of nitrogen incorporation is reduced to less than or about 0.5 at. %.

* * * * *